(12) United States Patent
Talbot

(10) Patent No.: US 7,613,266 B1
(45) Date of Patent: *Nov. 3, 2009

(54) BINARY CONTROLLED PHASE SELECTOR WITH OUTPUT DUTY CYCLE CORRECTION

(75) Inventor: Gerald Robert Talbot, Concord, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 660 days.

This patent is subject to a terminal disclaimer.

(21) Appl. No.: 11/033,641

(22) Filed: Jan. 13, 2005

(51) Int. Cl.
*H04L 7/00* (2006.01)

(52) U.S. Cl. .................. 375/371; 375/226; 375/362; 327/144; 327/141; 327/147; 327/151

(58) Field of Classification Search ............ 375/226, 375/362, 371
See application file for complete search history.

(56) References Cited

OTHER PUBLICATIONS

U.S. Appl. No. 11/033,755, filed Jan. 13, 2005, Talbot et al.
U.S. Appl. No. 11/033,758, filed Jan. 13, 2005, Talbot.

"AMD-3181™ HyperTransport™ PCI-X® Tunnel Data Sheet", 24637 Rev. 3.02, Aug. 10, 2004, pp. 1-87.

*Primary Examiner*—Shuwang Liu
*Assistant Examiner*—Lihong Yu
(74) *Attorney, Agent, or Firm*—Manelli Denison & Selter PLLC; Leon R. Turkevich

(57) ABSTRACT

A phase selection circuit having a selection circuit, binary weighted current sources, and an amplifier circuit. The phase selection circuit is configured for selecting adjacent phase signals from a number of equally-spaced phases of a clock signal, based on a phase selection value. The selection circuit outputs the adjacent phase signals to respective first and second binary weighted current sources, along with a digital interpolation value. The first current source outputs a contribution current onto a summing node based on the first adjacent phase signal and the digital interpolation control value, and the second current source outputs a second contribution current to the summing node based on the second adjacent phase signal and an inverse of the digital interpolation control value, resulting in an interpolated signal. An amplifier circuit outputs the interpolated signal as a phase-interpolated clock signal according to the phase selection value.

20 Claims, 6 Drawing Sheets

BINARY CONTROLLED PHASE SELECTOR WITH OUTPUT DUTY CYCLE CORRECTION

BACKGROUND OF THE INVENTION

1. Field of the Invention

The present invention relates to digital phase shifting systems configured for outputting a phase-shifted signal relative to a reference clock.

2. Background Art

Newer communications systems require advanced processing of high speed digital signals in order to accommodate precise timing requirements. For example, processor-based communications systems such as HyperTransport™ bus architectures rely on integrated circuits having phase shifting circuits for phase-shifting a clock signal, for example for timing synchronization.

Implementation of digital phase shifting systems in an integrated circuit, however, may suffer from numerous problems that may affect the integrity of the signal to be output. For example, digital systems often rely on binary coding, where a digital value composed of N bits has a range of values from zero to $2^N-1$. However, reliance on binary coding suffers from the disadvantage of Most Significant Bit (MSB) rollover, where a simultaneous transition in multiple bits due to a change in value (e.g., "7"=0111 to "8"=1000) creates numerous discontinuities in the circuits implementing the digital system, resulting in voltage spikes on the output signal; such voltage spikes may cause transient phase errors that may result in misinterpretation of a clock strobe, data, etc., resulting in errors due to instability of the output signal. Efforts to filter the voltage spikes from the output signal often are not practical in integrated circuits due to the added delay or the increased capacitance.

In addition, implementation of digital phase shifting systems in an integrated circuit may encounter errors due to nonlinearities due to process variations encountered during manufacture of the integrated circuit.

Finally, digital phase shifting systems may suffer from the problem of adding a bias to the reference clock signal that may affect the duty cycle of the output signal.

SUMMARY OF THE INVENTION

There is a need for an arrangement that enables precise control of phase selection in a phase selection circuit implemented within an integrated circuit.

There also is a need for an arrangement that enables a digital phase selection circuit to be implemented in a manner that does not introduce noise spikes or voltage spikes due to transitions in digital values.

There also is a need for an arrangement that enables a digital phase selection circuit to be implemented in an integrated circuit while introducing minimal capacitance to an output signal.

These and other needs are attained by the present invention, where an integrated circuit includes a phase selection circuit having a selection circuit, binary weighted current sources, and an amplifier circuit. The phase selection circuit is configured for selecting adjacent phase signals from a number of equally-spaced phases of a clock signal, based on a phase selection value. The selection circuit outputs the adjacent phase signals to respective first and second binary weighted current sources, along with a digital interpolation value. The first current source outputs a contribution current onto a summing node based on the first adjacent phase signal and the digital interpolation control value, and the second current source outputs a second contribution current to the summing node based on the second adjacent phase signal and an inverse of the digital interpolation control value, resulting in an interpolated signal. An amplifier circuit outputs the interpolated signal as a phase-interpolated clock signal according to the phase selection value.

One aspect of the present invention provides a phase selection circuit having a selection circuit, first and second binary weighted current sources, and an amplifier circuit. The selection circuit is configured for receiving a first prescribed number of phase signals representing respective equally-spaced phases of a clock signal. The selection circuit is configured for selecting and outputting, from the first prescribed number of phase signals, first and second adjacent phase signals based on a phase selection value representing one of a second prescribed number of phases, the second prescribed number a multiple of the first prescribed number. The selection circuit also is configured for outputting a digital interpolation control value based on the phase selection value relative to the first and second adjacent phase signals. The first and second binary weighted current sources are configured for outputting first and second contribution currents onto a summing node based on the first and second adjacent phase signals, respectively, and based on the digital interpolation control value. The first and second contribution currents form at the summing node an interpolated signal that is interpolated relative to the first and second adjacent phase signals and the digital interpolation control value. The amplifier circuit is configured for outputting the interpolated signal as a phase-interpolated clock signal, having a voltage swing between a first reference voltage and a second reference voltage, according to the phase selection value.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like element elements throughout and wherein.

BEST MODE FOR CARRYING OUT THE INVENTION

The disclosed embodiment is directed to an integrated circuit, for example a microprocessor or a device that interfaces with the microprocessor via a high-speed link such as a HyperTransport™ link, having a phase selection circuit for outputting a phase-adjusted clock signal in response to a reference clock and a phase selection value.

Figure 1:
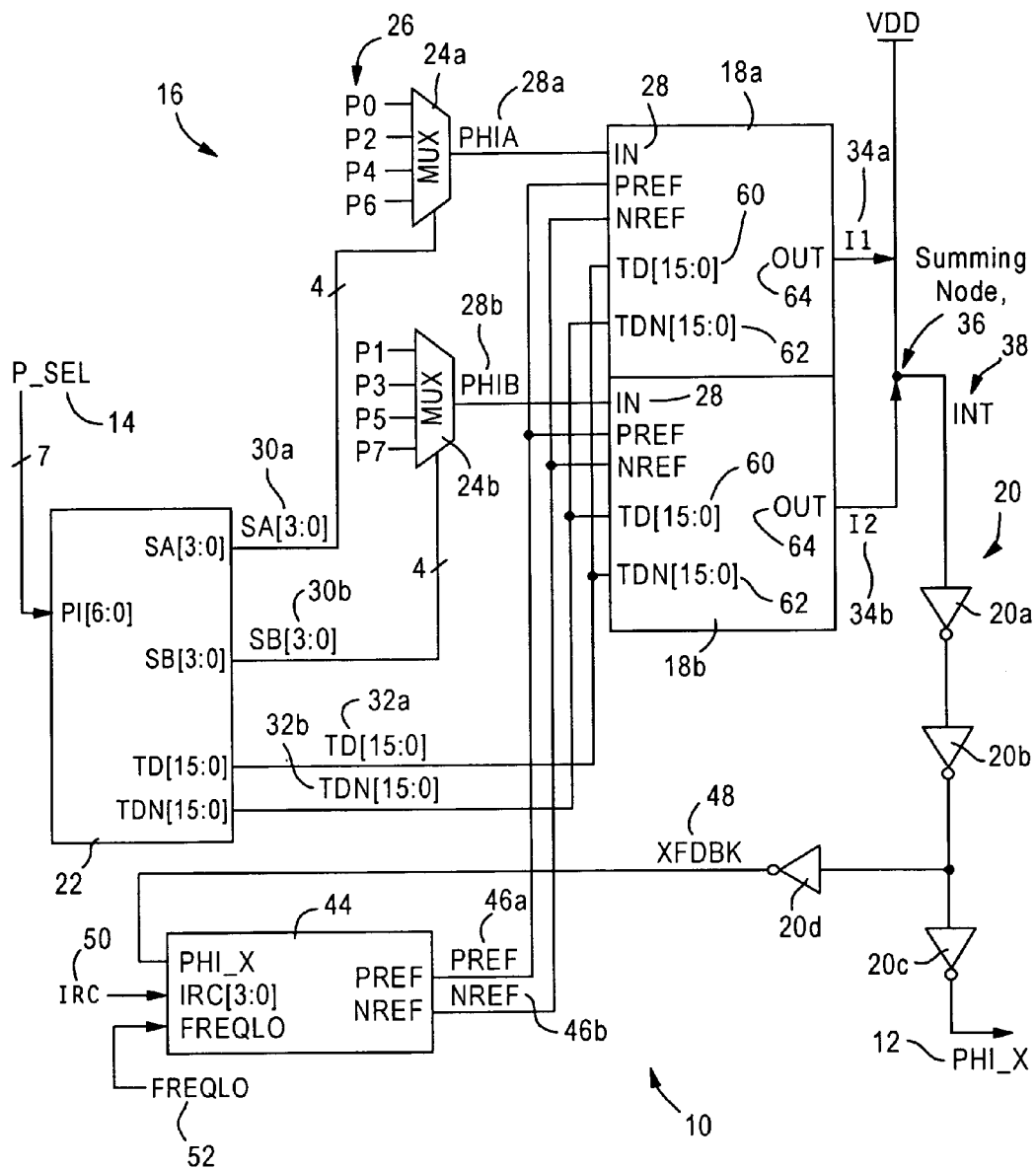
FIG. 1 is a block diagram illustrating the phase selection circuit according to an embodiment of the present invention.

FIG. 1 is a diagram illustrating a phase selection circuit 10, also referred to as a binary controlled phase generator, configured for generating a clock signal (PHI_X) 12. The phase selection circuit 10 generates the signal 12 to have a selected phase according to a phase selection value (P_SEL) 14, where the phase selection value 14 is a 7-bit digital value that specifies one of 128 available digital phase increments across a period of a single clock cycle.

As described below, the phase selection circuit 10 is configured for solving the problem of being able to precisely subdivide a reference clock into 128 equally spaced phase positions selected by binary control signals 14. Hence, the phase selection circuit 10 can be used for digitally controlled phase alignment circuits that require the ability to continuously rotate an output phase of a given signal.

Figure 2:
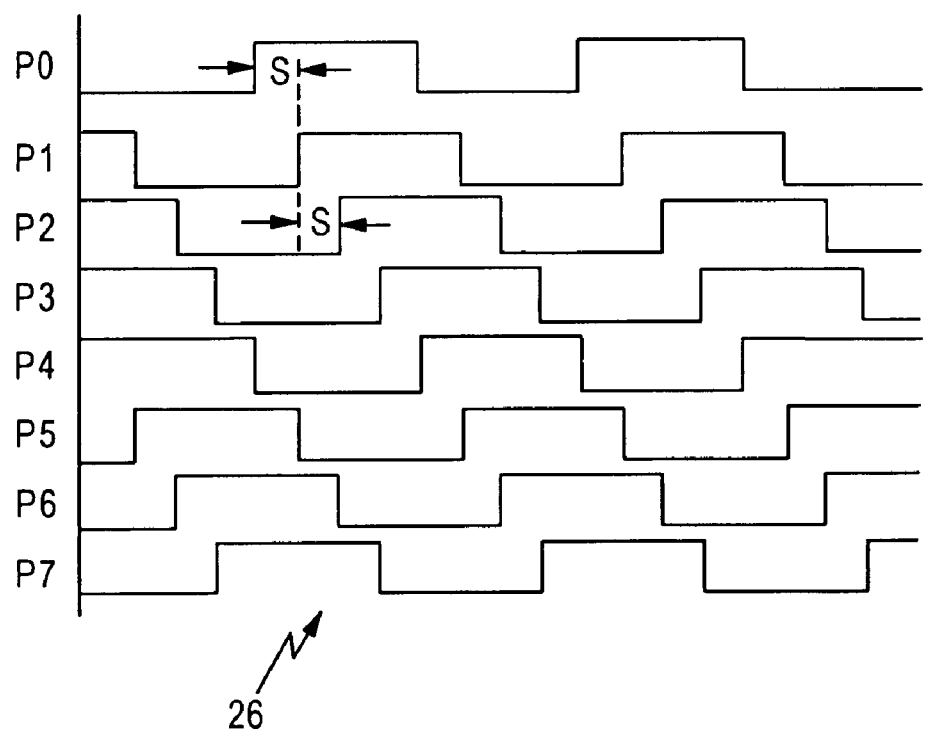
FIG. 2 is a diagram illustrating the phase signals supplied to the phase selection circuit as equally-spaced phases of a clock signal.

The phase selection circuit 10 includes a selection circuit 16, binary weighted current sources 18a and 18b, and an amplifier circuit 20. The selection circuit 16, which includes a decoder 22 and multiplexers 24a and 24b, is configured for receiving a prescribed number of phase signals (P0-P7) 26 that represent respective equally-spaced phases of a clock signal. As illustrated in FIG. 2, each phase signal (e.g., P1) has a separation S to an adjacent phase signal (e.g., P0 or P2) of one eighth (⅛) of a cycle (S=⅛). The phase signals (P1-P8) 26 are supplied, for example, by a poly-phase voltage-controlled oscillator (not shown), or a voltage-controlled delay line.

Figure 7:
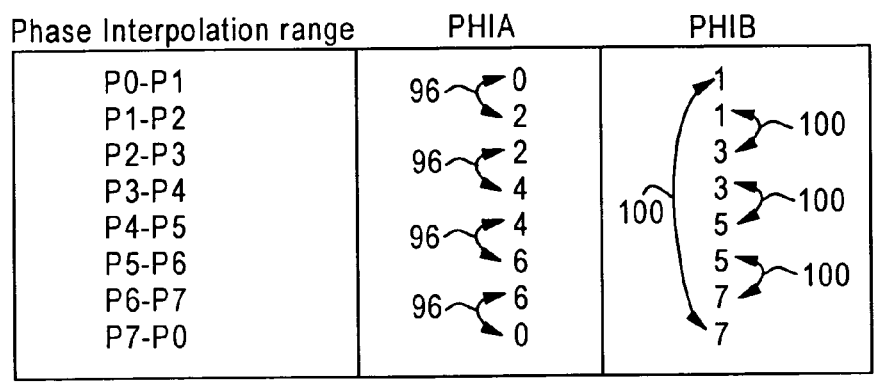
FIG. 7 is a diagram illustrating the selection of alternate phase indexes by the decoder of FIG. 1, according to an embodiment of the present invention.

The selection circuit 16 is configured for selecting and outputting, from the phase signals P0 through P7 26, a first phase signal (PHIA) 28a and a second phase signal (PHIB) 28b, where the first phase signal (PHIA) 28a and the second phase signal (PHIB) 28b are adjacent to each other as illustrated in FIG. 2 and FIG. 7, described below. In particular, each of the phase signals (PHIA) 28a and (PHIB) 28b have the same separation S of one eighth (⅛) of a cycle as illustrated in FIG. 2; hence, the phase signals (PHIA) 28a and (PHIB) 28b also are referred to herein as first and second adjacent phase signals, respectively.

The selection circuit 16 is configured such that the multiplexer 24a is configured for receiving the even index of the phase signals 26 (P0, P2, P4, P6), and the second multiplexer 24b is configured for receiving the odd index of the phase signals 26 (P1, P3, P5, P7).

The decoder 22 is configured for outputting 4-bit selection signals (SA) 30a and (SB) 30b to multiplexers 24a and 24b for selection of the first and second adjacent phase signals 28a and 28b, respectively. The decoder 22 is configured for identifying the appropriate selection signals 30a and 30b based on the received phase selection value (P_SEL) 14. In particular, the decoder 22 is configured for identifying the two phase signals 26 to which the phase selection value (P_SEL) 14 is bounded between; for example, if the phase signals P0, P1 and P2 represented respective digital phase values of "0", "15", and "31", and the phase selection value (P_SEL) 14 has a value of "P_SEL=23", then the decoder 22 would identify that the phase selection value (P_SEL=23) is between the phase signals P1 (P1=15) and P2 (P2=31). In this case, the decoder 22 would output the selection signals 30a (SA="0010") and SB 30b (SB="0001") to the multiplexers 24a and 24b for selection of the phase signals P2 and P1, as the first and second phase signals PHIA 28a and PHIB 28b, respectively.

In addition, the decoder 22 is configured for identifying a digital interpolation control value (TD) 32a that identifies the difference between the received phase selection value (P_SEL) 14 (e.g., P_SEL=23) and the selected phase signals PHIA 28a (e.g., P2=31) and PHIB 28b (e.g., P1=15). In this case, the difference between the received phase selection value (P_SEL) 14 (e.g., P_SEL=23) and PHIB 28b (e.g., P1=15) is "8", hence the decoder 22 sets the digital interpolation control value (TD) 32a equal to "8". As described below, the digital interpolation control value (TD) 32a is implemented as a thermometer encoded group of control bits, where "thermometer encoding" refers to encoding a data value as a group of monotonically increasing bits.

In particular, in "thermometer encoding" a value is incremented by transitioning only one bit from a zero to a one value; hence, a four-bit thermometer-encoded code "0000" is incremented to values "1, 2, 3, 4" by incrementing a contiguous bit in the sequence "0001", "0011", "0111", and "1111", respectively. Hence, a thermometer-decoded value (e.g., TD 32a) is defined as having a first contiguous group of bits having a true value, wherein any bits within the digital interpolation control value (TD) 32a having a false value are contiguous and separated by the first contiguous group by a single transition ("01"). As described below, the use of thermometer encoding in the digital interpolation control value TD 32a enables each bit to control a corresponding current source module (described below with respect to FIG. 4); hence, since every bit is considered a "least significant bit", use of thermometer decoding prevents rollover of a most significant bit and enables successive current source modules to be selectively enabled or disabled, resulting in a monotonic transition that prevents any discontinuity in current supply that may otherwise a voltage transient.

Hence, the decoder 22 outputs to the current sources 18a and 18b the digital interpolation control value TD 32a as a thermometer-encoded value. The decoder also outputs to the current sources 18a and 18b an inverse 32b (TDN) of the thermometer-encoded digital interpolation control value TD 32a. Use of the control values 32a and 32b is described in detail below with respect to FIG. 4.

In the above example it was assumed that there is no delay in the circuit 10; as apparent from the description below with respect to FIG. 5, however, a constant delay can be identified and added to the decoder 22 as a calibration value to ensure that the decoder 22 selects the selection signals 30a and 30b and the digital interpolation control values 32a and 32b, based on the identified delay, to ensure that the output signal (PHI_X) 12 matches the phase selection value (P_SEL) 14.

The binary weighted current sources 18a and 18b are configured for outputting first and second contribution currents I1 34a and I2 34b onto a summing node 36 based on the first and second adjacent phase signals PHIA 28a and PHIB 28b, respectively, and based on the digital interpolation control value TD 32a and its inverse TDN 32b. The first and second contribution currents I1 34a and I2 34b form at the summing node an interpolated signal INT 38 that is interpolated relative to the first and second adjacent phase signals PHIA 28a and PHIB 28b, the digital interpolation control value TD 32a, and its inverse 32b.

The phase selection circuit 10 also includes an amplifier circuit 20, including at least amplifiers 20a, 20b, and 20c, that are configured for outputting the interpolated signal INT 38 as the phase-interpolated clock signal PHI_X 12. The voltage of the interpolated signal INT 38 is induced at the summing node 36 based on the intrinsic capacitance of the integrated circuit between the summing node 36 and the limiting amplifier 20*a*; in other words, the intrinsic capacitance can be modeled by a capacitor (not shown) having a first terminal coupled to the summing node 36 and a second terminal end coupled to ground.

Figure 5:
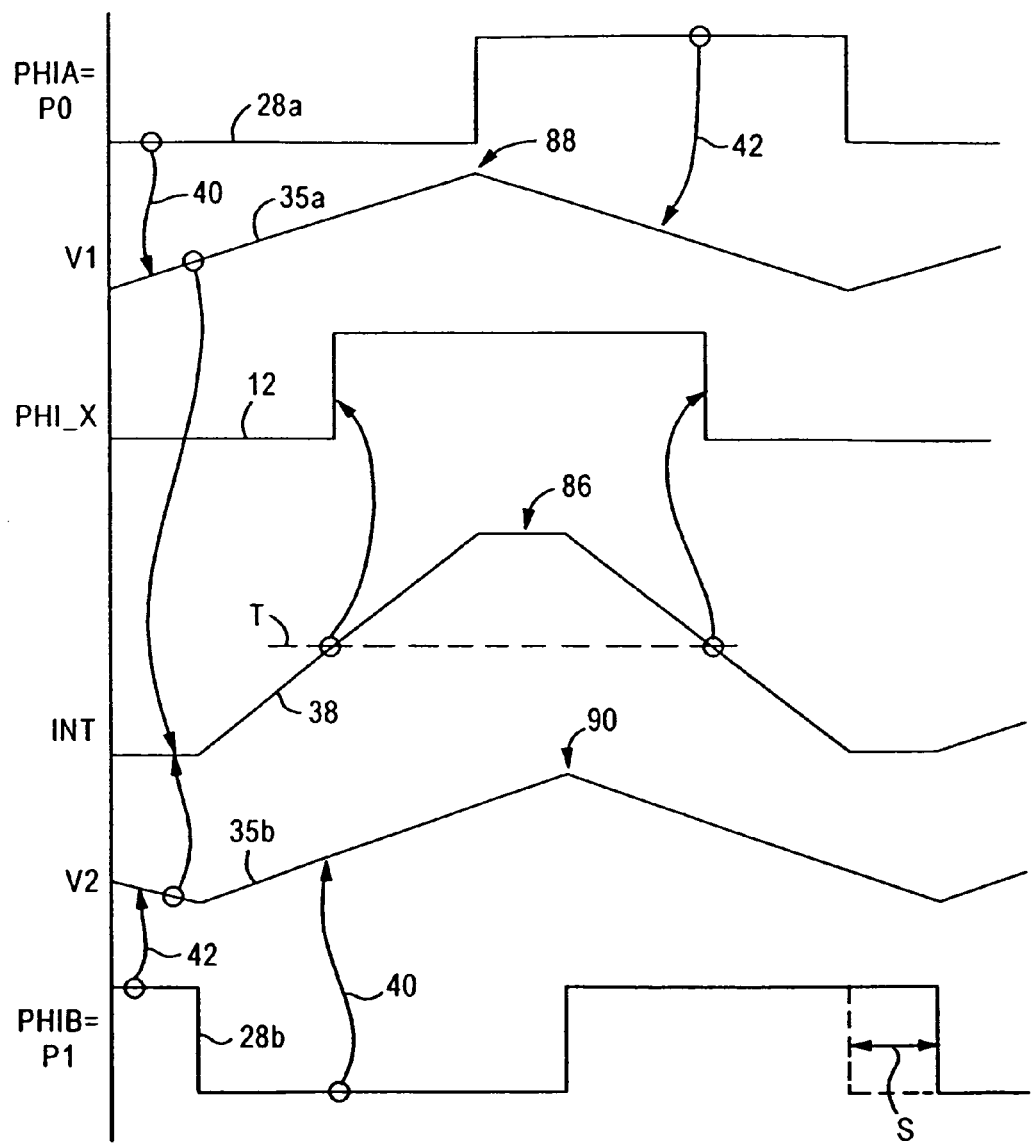
FIG. 5 is a diagram illustrating generation of an interpolated signal used to generate the phase-interpolated clock signal by the phase selection circuit of FIG. 1.

The amplifier 20 includes a limiting amplifier 20*a* configured for outputting a voltage signal in response to an induced voltage of the interpolated signal INT 38 exceeding a prescribed threshold T, illustrated in FIG. 5. As recognized in the art, the threshold T for a CMOS inverter is nominally one half the reference supply voltage (VDD). Each amplifier 20*a* and 20*b*, implemented for example as a CMOS inverter, has a gain of about "10", such that the amplifiers 20*a* and 20*b* in series produce a gain of about "100". Hence, the amplifier 20*b* is configured for outputting the signal output of the amplifier 20*a* between prescribed voltage rails VDD and VSS, also referred to as first and second reference voltages. In other words, the amplifier 20*b* is able to generate a 1 volt (V) swing based on the amplifier 20*a* detecting a 0.01V volt above the threshold T. Hence, the second amplifier 20*b* ensures the output signal PHI_X 12 has a voltage swing between a first reference voltage VDD and a second reference voltage VSS, according to the phase selection value. The buffers 20*c* and 20*d* are configured for inverting the output signal with a unitary (e.g., "1") gain. Any variations in the threshold T (e.g., due to process variations) can be controlled by changing the slew rate of the contribution currents I1 34*a* and I2 34*b*, described below.

FIG. 5 is a diagram illustrating overall operation of the current sources 18*a* and 18*b* and the amplifier circuit 20 in generating the output signal PHI_X 12, according to an embodiment of the present invention. Assume in this example that the multiplexers 24*a* and 24*b* output the adjacent phase signals P0 and P1, respectively, and that the decoder 22 outputs a digital interpolation control value 32*a* having a value of "TD=8". As described in detail below with respect to FIGS. 3 and 4, each of the current sources 18*a* and 18*b* is configured for supplying the corresponding contribution current I1 34*a* and I2 34*b* to the summing node 36 in response to deassertion of the corresponding adjacent phase signal 28*a* and 28*b*, illustrated as respective voltage signals V1 35*a* and V2 35*b* at node 36, for example as illustrated with respect to event 40. Each of the current sources 18*a* and 18*b* also is configured for draining (i.e., reducing) the corresponding contribution current I1 34*a* and I2 34*b* to the summing node 36 in response to assertion of the corresponding adjacent phase signal 28*a* and 28*b*, for example illustrated with respect to the respective voltage signals V1 35*a* and V2 35*b* at event 42. As described below with respect to FIG. 3, each contribution current I1 32*a* and I2 32*b* is based on a sum total of current supplies and current drains by current source modules in each corresponding current source 18*a* and 18*b*. In addition, the current supply and current drain are performed at rates controlled by respective current control signals, described below.

The phase selection circuit 10 of FIG. 1 also includes a current magnitude controller 44 configured for controlling the current magnitude by the current source 18*a* and 18*b* in sourcing or draining the respective currents I1 32*a* and I2 34*b*. In particular, the current magnitude controller 44 is configured for controlling the current magnitude supply by outputting analog current control signals PREF 46*a* and NREF 46*b*, to the current sources 18*a* and 18*b*, based on comparing the phase-interpolated clock signal XFDBK 48 output by the buffer 20*d* relative to a prescribed calibration value IRC 50. The prescribed calibration value IRC 50 is supplied by a calibration circuit (not shown) configured for calibrating the integrated circuit with respect to precision resistors that are externally coupled to the integrated circuit (i.e., off-chip) and having a tolerance of about one percent (1%).

As described below with respect to FIG. 4, the current control signal PREF 46*a* is configured for controlling the supply of current by each current source 18*a* and 18*b* relative to the digital interpolation control value TD 32*a* and TDN 32*b* as described below, at a corresponding slew rate. The current control signal NREF 46*b* is configured for controlling the drain of current by each corresponding current source 18*a* and 18*b* relative to the digital interpolation control value TD 32*a* and TDN 32*b*, at a corresponding slew rate.

Hence, the current magnitude controller 44 provides a feedback control system for adjusting the current sources 18*a* and 18*b* using the current control signals PREF 46*a* and NREF 46*b* based on the feedback signal 48, and based on the calibration value IRC 50. Hence, the current magnitude controller 44 is configured for controlling a duty cycle of the phase-interpolated clock signal 38 of FIG. 5 based on the controlling the first and second current control signals PREF 24*a* and NREF 46*b*.

The current magnitude controller 44 also is configured for setting the first and second slew rates to a high slew rate or a low slew rate based on a frequency selection input signal FREQLO 52. Hence, the controller 44 is configured for setting the current control signals PREF 24*a* and NREF 46*b* for a relatively high slew rate in response to detecting the frequency selection input signal FREQLO 52 indicating a high frequency, while maintaining a 50% duty cycle. Conversely, the controller 44 is configured for setting the current control signals PREF 24*a* and NREF 46*b* for a relatively low slew rate in response to detecting the frequency selection input signal FREQLO 52 indicating a low frequency, while maintaining a 50% duty cycle.

Figure 3:
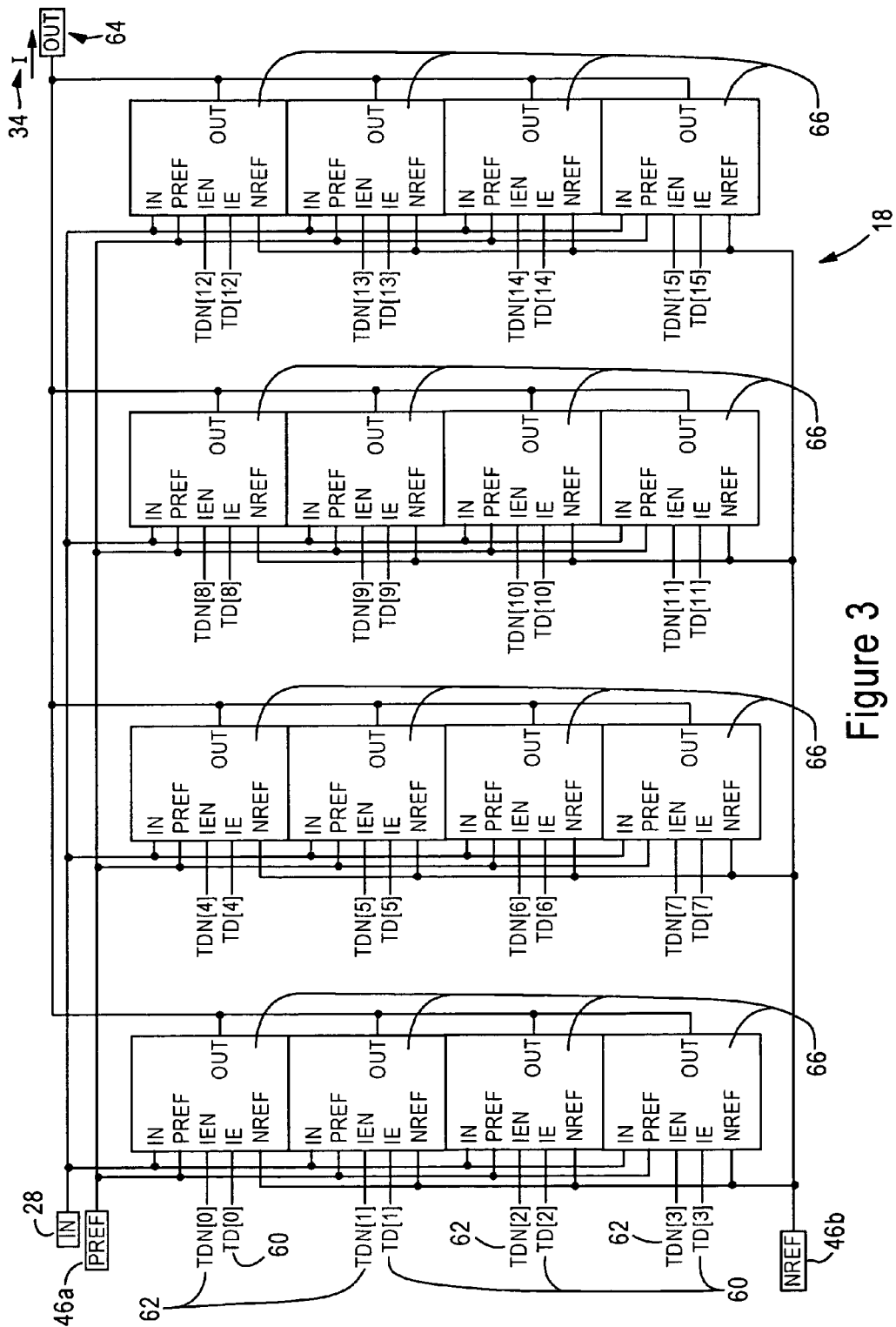
FIG. 3 is a diagram illustrating one of the binary weighted current, sources of FIG. 1, including multiple current source modules, according to an embodiment of the present invention.

FIG. 3 is a diagram illustrating one of the current sources 18 (e.g., 18*a* or 18*b*), according to an embodiment of the present invention. As apparent from FIG. 1, the current sources 18*a* and 18*b* are identical in structure, and differ only in the inputs for the corresponding adjacent phase signal 28 (e.g., PHIA 28*a* or PHIB 28*b*).

Each current source 18 (e.g., 18*a* and 18*b* of FIG. 1) includes a plurality of current source modules 66. Each current source module 66 is configured for selectively contributing to the corresponding contribution current I 34 (e.g., I1 34*a* and I2 34*b* of FIG. 1) based on the corresponding adjacent phase signal 28, the current control signals PREF 46*a* and NREF 46*b*, a corresponding control bit (e.g., TD[0]) 60 from the thermometer-decoded digital interpolation control value TD 32*a*, plus the corresponding control bit (e.g., TDN [0]) 62 from the inverse TDN 32*b*.

Figure 4:
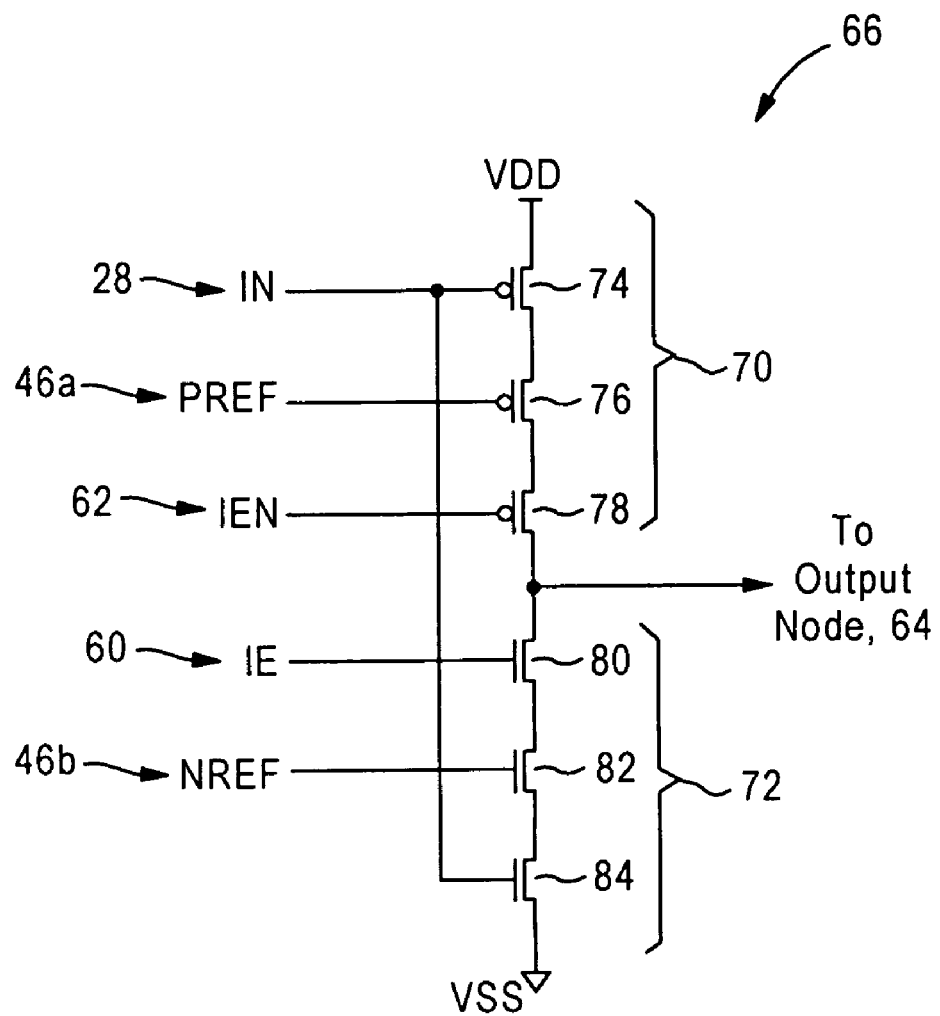
FIG. 4 is a diagram illustrating in detail one of the current source modules of FIG. 3, according to an embodiment of the present invention.

FIG. 4 is a diagram illustrating in detail a current source module 66. The current source module 66 includes a pull-up transistor circuit 70 and a pull-down transistor circuit 72. The pull-up transistor circuit 70 includes P-FET transistors 74, 76 and 78 connected in series, and the pull-down transistor circuit 72 includes N-FET transistors 80, 82, and 84 connected in series.

The P-FET transistor 74 of the pull-up transistor circuit 70 is configured for supplying the corresponding current to the summing node 36 (via output node 64) in response to deassertion of the corresponding adjacent phase signal IN 28 (IN=0). The P-FET transistor 76 is configured for supplying the corresponding current at the prescribed slew rate in response to the current control signal PREF 46*a*. The P-FET transistor 78 is configured for enabling the pull-up transistor circuit 78 based on deassertion of the corresponding inverse control bit 62 (IEN=0).

The N-FET transistor 84 of the pull-down transistor circuit 72 is configured for draining the corresponding current from the summing node 34 (via the output node 64) in response to assertion of the corresponding adjacent phase signal IN 28 (IN=1). The N-FET transistor 82 is configured for draining the corresponding current at the slew rate in response to the second current control signal NREF 46*b*, and the N-FET transistor 80 is configured for enabling the pull-down transistor circuit 72 based on the assertion of the corresponding control bit (IE=1) 60.

Hence, each current source module 66 is selectively enabled based on the corresponding control bit 60 being asserted (IE=1) and the inverse control bit being deasserted (IEN=0). As apparent from above, the current source modules 66 of the current source 18*a* receive the corresponding control bit 60 from the digital interpolation control value TD 32*a*, and the corresponding inverse control bit 62 from the inverse control value TDN 32*b*, whereas the current source modules 66 of the current source 18*b* receive the corresponding control bit 60 from the inverse digital interpolation control value TDN 32*b*, and the corresponding inverse control bit 62 from the digital interpolation control value TD 32*a*.

Consequently, each current control module 66, if enabled by its corresponding inverse enable signal 62 (IEN=0), sources (i.e., supplies) current to the summing node 36 at the slew rate controlled by the current control signal PREF 46*a*, based on the corresponding input signal IN 28 being deasserted; each current control module 66 that is enabled (IE=1) drains (i.e., removes) current from the summing node 36 at the slew rate controlled by the current control signal NREF 46*b*, based on the corresponding input signal IN 28 being asserted.

As apparent from the foregoing, the combination of current modules 66 in each current source 18 enables a linear increase or decrease in the current supply I 34 by the current source 18 to its corresponding output node 64 based on the number of its internal current source modules 66 that are enabled by the respective control bits 60 of the thermometer-decoded digital interpolation control values TD 32*a* (for current supply 18*a*), or conversely the inverse bits 62 of the inverse value TDN 32*b* (for current supply 18*b*). Consequently, the interpolation control values TD 32*a* and TDN 32*b* are used to control the weighting of the adjacent phase signals PHIA 28*a* and PHIB 28*b* in determining an interpolated value 38. In addition, the current control signals PREF 46*a* and PREF 46*b* are used to control the slew rate of the current signals 34*a* and 34*b* in order to maintain a 50% duty cycle, as well as select between a high frequency clock and a low frequency clock.

As illustrated in FIG. 5, an equal contribution by both current sources 18*a* and 18*b* based on the interpolation control value 32*a* having an equal weighting relative to the inverse 32*b* (e.g., TD=0000000011111111 and TDN=1111111100000000) results in an interpolated signal 38 having a voltage peak 86 equidistant between the peaks 88 and 90 of the signals V1 and V2, respectively, and the rising edges of the phase signals 28*a* and 28*b*, respectively. An unequal weighting, due to a change in the interpolation control values TD 32*a* and TDN 32*b*, will skew the interpolated signal 38 toward the higher-weighted phase signal 28*a* or 28*b*, causing a corresponding phase shift in the output signal PHI_X 12.

Hence, a digital precise interpolation control can be implemented without introducing voltage spikes due to transients that may be interpreted as a runt pulse by pulse detection circuitry. As described above, the decoder 22 in implementation will adjust for the delay introduced between the peak 86 and the intended phase shift, ensuring that the output signal PHI_X 12 will match the phase selection value P_SEL 14. In addition, the current magnitude controller 44 adjusts the control signals 46*a* and 46*b* to ensure precise alignment of the output signal PHI_X 12 relative to the amplifier threshold T.

Figure 6:
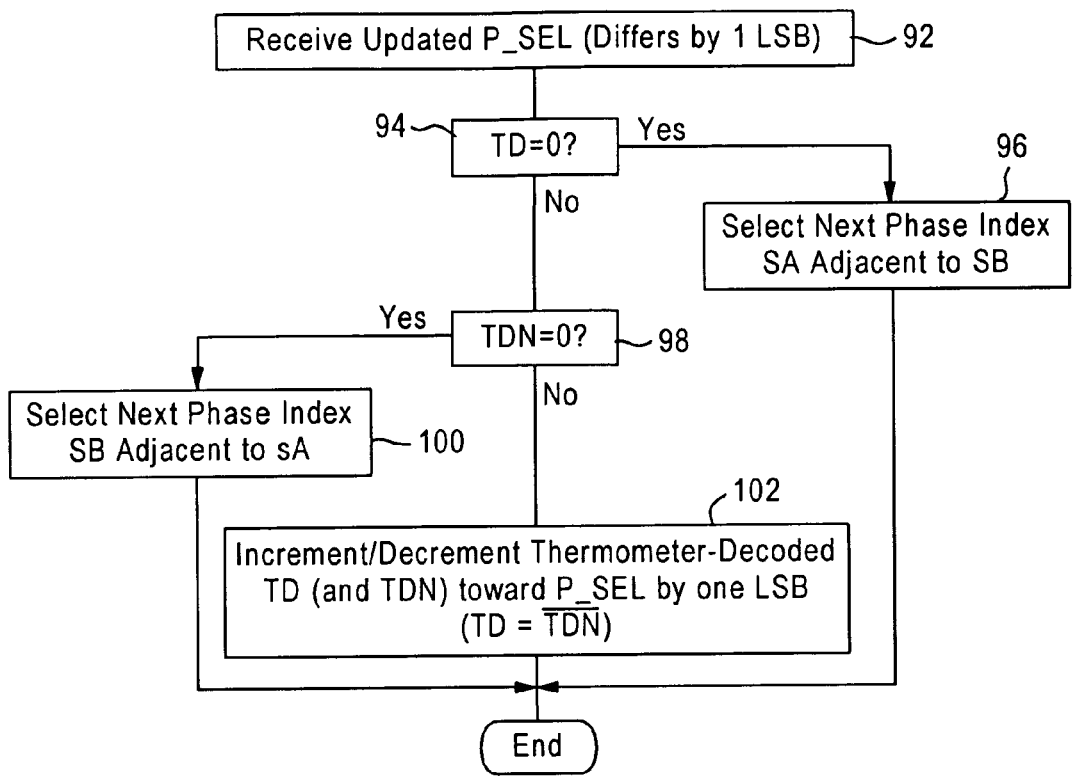
FIG. 6 is a diagram illustrating operations by the decoder of FIG. 1 in selecting a new selection signal or a new digital interpolation control value in response to an updated phase selection value.

FIG. 6 is a diagram illustrating operation of the decoder 22 in response to an increment or a decrement in the phase selection value P_SEL 14. As described above, the decoder outputs the interpolation values 32*a*, 32*b* and the selection values 30*a*, 30*b* in a manner that ensures that the number of current modules 66 that are enabled increases or decreases monotonically, ensuring linear changes in the current and voltage signals to prevent any voltage spikes from being asserted on the current summing node INT 36.

In response to receiving an updated phase selection value P_SEL (that differs by only one least significant bit to minimize transients) in step 92, the decoder 22 checks in step 94 if the digital interpolation control value TD 32*a* equals zero.

If the decoder 22 determines that the control value TD 32*a* equals zero, indicating no current is being supplied by the current source 18*a*, the decoder 22 selects in step 96 the next phase index SA 30*a* that is adjacent to SB 30*b*, illustrated for example in FIG. 7 as event 96. Hence, the decoder 22 selects an alternate phase index 30*a* depending on the complementary phase index SB 30*b* of the complementary adjacent phase signal PHIB 28*b*.

If in step 94 the decoder 22 determines that the control value TD 32*a* does not equal zero, the decoder checks in step 98 whether the inverse control value TDN 32*b* equals zero, indicating no current is being supplied by the current source 18*b*. If the inverse control value TDN 32*b* equals zero, the decoder 22 selects in step 100 the next phase index SB 30*b* that is adjacent to SA 30*a*, illustrated for example in FIG. 7 as event 100. Hence, the decoder 22 selects an alternate phase index SB 30*b* depending on the complementary phase index SA 30*a* of the complementary adjacent phase signal PHIA 28*a*.

Hence, a phase index 30*a* or 30*b* is changed only if the corresponding current source 18*a* or 18*b* is disabled, to ensure no transients are introduced to the summing node 36.

If in step 98 neither TD 32*a* or TDN 32*b* are zero, then the decoder 22 increments/decrements the thermometer decoded interpolation control value TD 32*a* (and the corresponding inverse TDN 32*b*) in step 102 toward the phase selection value P_SEL by setting or resetting a single bit of the thermometer decoded values TD 32*a* and TDN 32*b*, accordingly.

According to the disclosed embodiment, digital phase control is implemented based on selecting two adjacent input phases, and modulating two binary weighted current sources based on the respective adjacent input phases. The binary weighting is implemented using thermometer-decoded digital interpolation control values, insuring that any current change is monotonic to prevent discontinuities that may cause phase glitches. The result between the two current sources is a triangular waveform that has a phase that is interpolated between the two selected input phases.

In addition, a duty cycle feedback loop modulates the pull-up current mirror in each current source to avoid duty cycle distortion across the phase, voltage, and temperature variations during operation, as well as due to any changes in phase selection. The pull-down current mirror in the current sources use an on-chip calibrated current reference that ensures the voltage ramp on the summing node does not saturate nor have insufficient voltage swing for the output amplifier.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A phase selection circuit comprising:
   a selection circuit configured for receiving a first prescribed number of phase signals representing respective equally-spaced phases of a clock signal, the selection circuit configured for selecting and outputting, from the first prescribed number of phase signals, first and second adjacent phase signals based on a phase selection value representing one of a second prescribed number of phases, the second prescribed number a multiple of the first prescribed number, the selection circuit further configured for outputting a digital interpolation control value based on the phase selection value relative to the first and second adjacent phase signals;
   first and second binary weighted current sources configured for outputting first and second contribution currents onto a summing node based on the first and second adjacent phase signals, respectively, and based on the digital interpolation control value, the first and second contribution currents forming at the summing node an interpolated signal that is interpolated relative to the first and second adjacent phase signals and the digital interpolation control value; and
   an amplifier circuit configured for outputting the interpolated signal as a phase-interpolated clock signal, having a voltage swing between a first reference voltage and a second reference voltage, according to the phase selection value.

2. The phase selection circuit of claim 1, further comprising a current magnitude controller configured for controlling a current magnitude supply by each of the first and second binary weighted current sources, the current magnitude controller controlling the current magnitude supply based on comparing the phase-interpolated clock signal relative to a prescribed calibration.

3. The phase selection circuit of claim 2 wherein:
   the current magnitude controller is configured for outputting first and second current control signals to each of the first and second binary weighted current sources, the first current control signal configured for controlling a supply of current, by each corresponding first and second binary weighted current source and relative to the digital interpolation control value, at a corresponding first rate to the summing node, the second current control signal configured for controlling a drain of current by each corresponding first and second binary weighted current source and relative to the digital interpolation control value, at a corresponding second rate from the summing node,
   the current magnitude controller is configured for controlling a duty cycle of the phase-interpolated clock signal based on the controlling the first and second current control signals.

4. The phase selection circuit of claim 3, wherein the selection circuit includes:
   a decoder configured for outputting the digital interpolation control value as a thermometer encoded group of control bits and an inverse digital interpolation control value as a digital inverse of the digital interpolation control value, the decoder further configured for selecting first and second selection signals identifying the first and second adjacent phase signals relative to the phase selection value;
   a first multiplexer configured for selecting the first adjacent phase signal, from among an even index of the phase signals, in response to the first selection signal; and
   a second multiplexer configured for selecting the second adjacent phase signal, from among an odd index of the phase signals, in response to the second selection signal.

5. The phase selection circuit of claim 4, wherein in response to a detected change in the phase selection value, the decoder is configured for:
   changing the first selection signal for selection of a third phase signal adjacent to the second adjacent signal, if the digital interpolation control value has a minimum value, and
   changing the second selection signal for selection of a fourth phase signal adjacent to the first adjacent signal, if the inverse digital interpolation control value has a minimum value,
   wherein if the digital interpolation control value has neither the minimum value nor the maximum value, the decoder is configured for changing the digital interpolation control value to a new digital interpolation control value and preserving the first and second selection signals.

6. The phase selection circuit of claim 4, wherein:
   the first binary weighted current source including a plurality of first current source modules, each first current source module configured for selectively contributing to the first contribution current based on the first adjacent phase signal, the first and second current control signals, and a corresponding one of the control bits;
   each first current source module enabled by the corresponding control bit and configured for selectively supplying current at the first rate and draining current at the second rate based on deassertion and assertion of the first adjacent phase signal, respectively.

7. The phase selection circuit of claim 6, wherein:
   the second binary weighted current source including a plurality of second current source modules, each second current source module configured for selectively contributing to the second contribution current based on the second adjacent phase signal, the first and second current control signals, and a corresponding one of the control bits;
   each second current source module enabled by the inverse of the corresponding control bit and configured for selectively supplying current at the first rate and draining current at the second rate based on deassertion and assertion of the second adjacent phase signal, respectively.

8. The phase selection circuit of claim 7, wherein each of the first and second current source modules include:
   a pull-up transistor circuit having a first transistor configured for supplying the corresponding current to the summing node in response to deassertion of the corresponding adjacent phase signal, a second transistor configured for supplying the corresponding current at the first rate in response to the first current control signal, and a third transistor configured for enabling the pull-up transistor circuit based on the corresponding one of the control bit and the corresponding inverse; and
   a pull-down transistor circuit having a fourth transistor configured for draining the corresponding current from the summing node in response to assertion of the corresponding adjacent phase signal, a fifth transistor configured for draining the corresponding current at the second rate in response to the second current control signal, and a sixth transistor configured for enabling the pull-down transistor circuit based on the corresponding one of the inverse of the control bit and the control bit.

9. The phase selection circuit of claim 4, wherein:
the first binary weighted current source includes a first plurality of current source modules configured for selectively contributing to the first contribution current based on enabling by the respective control bits of the digital interpolation control value, and
the second weighted current source includes a second plurality of said current source modules, the second plurality of said current source modules configured for selectively contributing to the second contribution current based on enabling by the respective control bits of the inverse digital interpolation control value.

10. A method in a phase selection circuit on an integrated circuit, the method comprising:
first providing within the phase selection circuit on the integrated circuit a selection circuit configured for receiving a first prescribed number of phase signals representing respective equally-spaced phases of a clock signal,
selecting and outputting, from the first prescribed number of phase signals, first and second adjacent phase signals based on a phase selection value representing one of a second prescribed number of phases, the second prescribed number a multiple of the first prescribed number, the selection circuit further configured for outputting a digital interpolation control value based on the phase selection value relative to the first and second adjacent phase signals;
second providing within the phase selection circuit first and second binary weighted current sources configured for outputting first and second contribution currents onto a summing node based on the first and second adjacent phase signals, respectively, and based on the digital interpolation control value, the first and second contribution currents forming at the summing node an interpolated signal that is interpolated relative to the first and second adjacent phase signals and the digital interpolation control value; and
outputting the interpolated signal as a phase-interpolated clock signal by an amplifier circuit in the phase selection circuit, the interpolated signal having a voltage swing between a first reference voltage and a second reference voltage, according to the phase selection value.

11. The method of claim 10, further comprising providing a current magnitude controller configured for controlling a current magnitude supply by each of the first and second binary weighted current sources, the current magnitude controller controlling the current magnitude supply based on comparing the phase-interpolated clock signal relative to a prescribed calibration.

12. The method of claim 11 wherein:
the current magnitude controller is configured for outputting first and second current control signals to each of the first and second binary weighted current sources, the first current control signal configured for controlling a supply of current, by each corresponding first and second binary weighted current source and relative to the digital interpolation control value, at a corresponding first rate to the summing node, the second current control signal configured for controlling a drain of current by each corresponding first and second binary weighted current source and relative to the digital interpolation control value, at a corresponding second rate from the summing node,
the current magnitude controller is configured for controlling a duty cycle of the phase-interpolated clock signal based on the controlling the first and second current control signals.

13. The method of claim 12, wherein the selection circuit includes:
a decoder configured for outputting the digital interpolation control value as a thermometer encoded group of control bits and an inverse digital interpolation control value as a digital inverse of the digital interpolation control value, the decoder further configured for selecting first and second selection signals identifying the first and second adjacent phase signals relative to the phase selection value;
a first multiplexer configured for selecting the first adjacent phase signal, from among an even index of the phase signals, in response to the first selection signal; and
a second multiplexer configured for selecting the second adjacent phase signal, from among an odd index of the phase signals, in response to the second selection signal.

14. The method of claim 13, wherein in response to a detected change in the phase selection value, the decoder is configured for:
changing the first selection signal for selection of a third phase signal adjacent to the second adjacent signal, if the digital interpolation control value has a minimum value, and
changing the second selection signal for selection of a fourth phase signal adjacent to the first adjacent signal, if the inverse digital interpolation control value has a minimum value,
wherein if the digital interpolation control value has neither the minimum value nor the maximum value, the decoder is configured for changing the digital interpolation control value to a new digital interpolation control value and preserving the first and second selection signals.

15. The method of claim 13, wherein:
the first binary weighted current source including a plurality of first current source modules, each first current source module configured for selectively contributing to the first contribution current based on the first adjacent phase signal, the first and second current control signals, and a corresponding one of the control bits;
each first current source module enabled by the corresponding control bit and configured for selectively supplying current at the first rate and draining current at the second rate based on deassertion and assertion of the first adjacent phase signal, respectively.

16. The method of claim 15, wherein:
the second binary weighted current source including a plurality of second current source modules, each second current source module configured for selectively contributing to the second contribution current based on the second adjacent phase signal, the first and second current control signals, and a corresponding one of the control bits;
each second current source module enabled by the inverse of the corresponding control bit and configured for selectively supplying current at the first rate and draining current at the second rate based on deassertion and assertion of the second adjacent phase signal, respectively.

17. The method of claim 16, wherein each of the first and second current source modules include:
a pull-up transistor circuit having a first transistor configured for supplying the corresponding current to the summing node in response to deassertion of the corresponding adjacent phase signal, a second transistor configured for supplying the corresponding current at the first rate in response to the first current control signal, and a third transistor configured for enabling the pull-up transistor circuit based on the corresponding one of the control bit and the corresponding inverse; and a pull-down transistor circuit having a fourth transistor configured for draining the corresponding current from the summing node in response to assertion of the corresponding adjacent phase signal, a fifth transistor configured for draining the corresponding current at the second rate in response to the second current control signal, and a sixth transistor configured for enabling the pull-down transistor circuit based on the corresponding one of the inverse of the control bit and the control bit.

18. The method of claim 13, wherein:

the first binary weighted current source includes a first plurality of current source modules configured for selectively contributing to the first contribution current based on enabling by the respective control bits of the digital interpolation control value, and the second weighted current source includes a second plurality of said current source modules, the second plurality of said current source modules configured for selectively contributing to the second contribution current based on enabling by the respective control bits of the inverse digital interpolation control value.

19. The phase selection circuit of claim 1, wherein:

the selection circuit includes a decoder configured for outputting the digital interpolation control value as a thermometer encoded group of control bits and an inverse digital interpolation control value having a second thermometer encoded group of control bits as a digital inverse of the digital interpolation control value;

the first binary weighted current source including a plurality of first current source modules, each first current source module configured for selectively contributing to the first contribution current based on the first adjacent phase signal and a corresponding one of the control bits; and the second binary weighted current source including a plurality of second current source modules, each second current source module configured for selectively contributing to the second contribution current based on the second adjacent phase signal and a corresponding one of the control bits of the inverse digital interpolation control value.

20. The method of claim 10, wherein:

the selection circuit includes a decoder configured for outputting the digital interpolation control value as a thermometer encoded group of control bits and an inverse digital interpolation control value having a second thermometer encoded group of control bits as a digital inverse of the digital interpolation control value;

the first binary weighted current source including a plurality of first current source modules, each first current source module configured for selectively contributing to the first contribution current based on the first adjacent phase signal and a corresponding one of the control bits; and the second binary weighted current source including a plurality of second current source modules, each second current source module configured for selectively contributing to the second contribution current based on the second adjacent phase signal and a corresponding one of the control bits of the inverse digital interpolation control value.

* * * * *